United States Patent

Ianenko et al.

[11] Patent Number: 5,903,160
[45] Date of Patent: May 11, 1999

[54] METHOD AND APPARATUS FOR TESTING AN ELECTRICAL CONDUCTOR ASSEMBLY

[75] Inventors: Evgueni Ianenko, Wertheim; Peter Bieber, Kitzingen; Uwe Rothaug, Marktheidenfeld, all of Germany

[73] Assignee: atg Test Systems GmbH, Wertheim, Germany

[21] Appl. No.: 08/743,196

[22] Filed: Nov. 5, 1996

[30] Foreign Application Priority Data

Nov. 6, 1995 [DE] Germany ............... 195 41 307

[51] Int. Cl.$^6$ ............................................ G01R 31/02
[52] U.S. Cl. .................. 324/537; 324/754; 324/158.1
[58] Field of Search ................................... 324/509, 519, 324/522, 527, 530, 537, 538, 754, 765, 158.1

[56] References Cited

U.S. PATENT DOCUMENTS

| | | | |
|---|---|---|---|
| 3,975,680 | 8/1976 | Webb | 324/537 |
| 3,992,663 | 11/1976 | Seddick | 324/537 |
| 4,528,500 | 7/1985 | Lightbody et al. | 324/537 |
| 4,565,966 | 1/1986 | Burr et al. | 324/754 |
| 5,218,294 | 6/1993 | Soiferman | 324/158.1 |
| 5,268,645 | 12/1993 | Prokoff et al. | 324/537 |
| 5,424,633 | 6/1995 | Soiferman | 324/158.1 |
| 5,631,572 | 5/1997 | Sheen et al. | 324/754 |
| 5,656,932 | 8/1997 | Kitayoshi | 324/615 |

FOREIGN PATENT DOCUMENTS

| | | | |
|---|---|---|---|
| 0246034 A2 | 11/1987 | European Pat. Off. | |
| 0 508 062 A1 | 2/1992 | European Pat. Off. | G01R 31/28 |
| 0527321 A1 | 2/1993 | European Pat. Off. | |
| 0 438 491 B1 | 7/1994 | European Pat. Off. | G01R 31/08 |
| 2 311 903 | 9/1974 | Germany | G01R 31/08 |
| 3408704 A1 | 9/1984 | Germany | G01R 31/28 |
| 195 41 307.5 | 2/1996 | Germany | G01R 31/28 |
| 02046034 | 2/1990 | Japan. | |

OTHER PUBLICATIONS

Bräunlich, V.D., "Zuverlässige Fehlersuche," *EPP Baugruppen*, pp. 44–45, (Jan./Feb. 1993). (Brief Summary in English Language).

*Primary Examiner*—Diep N. Do
*Attorney, Agent, or Firm*—Hamilton, Brook, Smith & Reynolds, P.C.

[57] ABSTRACT

A method of testing an electrical conductor assembly having a plurality of networks is divided into a first test routine and in further test routines. A conductor assembly is tested in each test routine. In a first test routine, a field test for detecting short-circuits between the individual networks and a resistance test for detecting open-circuits in said networks are implemented. From the data sets resulting from the field test, complex conductances are determined between at least one antenna employed in the field test and the tested networks, which are used as reference conductances for the further test routines. In the further test routines short-circuits between the networks and/or open-circuits in the networks are detected by sensing a complex actual conductance between each network and at least one antenna and by comparing the actual conductance to the reference conductance. In addition the invention relates to an apparatus for implementing the method.

37 Claims, 4 Drawing Sheets

METHOD AND APPARATUS FOR TESTING AN ELECTRICAL CONDUCTOR ASSEMBLY

BACKGROUND OF THE INVENTION

Circuit boards comprise from one to many resin layers. Conductor assemblies are embedded in these layers and typically have a large number of spatially closely located conductor paths or networks, which may or may not have branch points. In the manufacture of circuit boards, it is important to test these embedded conductor assemblies to ensure that they have been properly formed so that the electronic device constructed from the circuit board will operate properly.

German Patent Document DE 34 08 704 A1 discloses an apparatus for testing conductor assemblies of a circuit board in which the individual networks are tested using a resistance and capacitance test. The results obtained from this test are then compared to reference values from a conductor assembly that is known to have no faults. Deviations between the test results and the reference values from the faultless conductor assembly are indicative of the existence of a fault in the tested conductor assembly. The nature and location of the fault in the defective network may be then determined. This testing method has a proven record of success in view of that fact that the test itself is easy and fast to implement and permits reliable fault detection.

Aspects of this faultless conductor assembly test method, however, are complicated. The reference values may only be established by performing resistance and capacitance tests on a faultless conductor assembly, a so-called "golden board". Producing these golden boards is complicated and expensive and is not cost effective in case of many modern circuit boards that have high conductor path or network densities.

Due to the drawbacks associated with the faultless conductor assembly testing method, learning routines have been developed in which several identical conductor assemblies are tested. The resistance and capacitance test for selected conductor paths in the various conductor assemblies are compared to each other. Using these multiple tests coupled with complicated statistical evaluation, reliable reference values may be generated.

In order to avoid some of the drawbacks associated with the learning routine testing method, attempts have been made to compute the reference values from design software. These computations, however, necessitate substantial computer capacity. Moreover, in the case of systematic errors in the production of the circuit boards, the computed reference values may deviate from the actual reference values for the circuit boards.

European Patent Document EP 0 508 062 B1 discloses a method for testing electrical conductor assemblies in which elongated electrodes are arranged on the surface of the circuit board containing the conductor assemblies. These elongated electrodes are referred to as "antennas". Alternatively, in some situations, it is possible to use certain networks of the conductor assembly as antennas for testing of the other networks of the assembly. In this case, the external elongated electrodes are not necessary. A total of n antennas $A_1$–$A_n$ are used to test a selected one of the networks N in the conductor assembly.

According to this test method, a complex input voltage $U_0$ is applied to a selected one of the antennas $A_i$. The remaining antennas $A_1$–$A_{i-1}$ and $A_{i+1}$–$A_n$ are connected to ground (GND). Between the network N and the antenna $A_i$ exists the complex resistance, i.e., impedance, $Z_i = Z_{iR} + iZ_{iI}$, and between the remaining antennas $A_1$–$A_{i-1}$ and $A_{i+1}$–$A_n$ and the network N the complex resistance $Z$–$Z_i$, where Z is the complex total resistance between all antennas and the network N. The impedances for network N are determined by detecting the complex voltage $U_i = U_{iR} + iU_{iI}$ with a probe that typically has its own capacitance $C_p$.

The complex input voltage $U_0 = U_{0R} + U_{0I}$ comprises a constant DC voltage component and an AC voltage component having a specific frequency $2\pi\omega$. This input voltage $U_0$ is applied to each of the antennas in turn. The test result, the voltage $U_i$ induced in network N, is sensed each time. The resulting set of test results $U_1$–$U_n$ forms a data field, the values of which represent a "finger print" typically for the network N. This testing method is termed a field test.

As a general rule, the data fields of the various networks of a circuit board should differ. When the data fields of two networks are similar or identical, a short-circuit may exist between these two networks. The existence of the potential short-circuit may then be confirmed by a conventional short-circuit test in which the electrical resistance between these two networks is sensed. These short-circuit tests need to be implemented only on pairs of networks that have identical data fields. Therefore, the number of these short-circuit tests is small, as compared to similar testing methods. Testing for open-circuits is performed with a resistance test in which electrodes at the ends of the networks sense the resistance through the networks or by comparing the data field to a reference field.

The field test testing method may also be used in combination with resistance test. The short-circuit test is performed between every one of the individual networks. And, a resistance test is used to detect open-circuits for every one of the networks. Accordingly, no reference values or reference fields are needed. This approach simplifies the testing method substantially since no golden boards or other methods for determining reference values are required. Each and every conductor path or network, however, must be individually tested, which makes this field test testing method relatively tedious.

In summary, by employing reference fields, the field test testing method is substantially accelerated since only those networks that have data fields that do not agree with the reference fields must be tested. The problem still exists, however, in establishing these reference values or the reference fields.

SUMMARY OF THE INVENTION

According to the invention, a first conductor assembly is tested in a first test routine using a field test in which short-circuits between the various networks of the assembly are detected and in which a resistance test is performed to detect open-circuits for the various networks. From data fields obtained from these tests, conductances between the individual networks and corresponding antennas are determined and stored as reference conductances.

In subsequent test routines, short-circuits are detected by determining the complex conductances between each network and each antenna. The detected complex conductances are then compared to the corresponding reference conductances. To detect any open-circuits, a comparison is made between the detected conductances and the references conductances. By observing only the real component of the detected conductance, high-impedance short-circuits between the networks and open-circuits in the networks can be determined.

The apparatus for implementing the preceding method preferably includes electrodes that can be brought into contact with predetermined test points on the networks of conductor assembly. A function generator is then used to output an input voltage to an antenna. A first evaluation circuit senses the voltage induced in the network to be tested, and a second evaluation circuit is used to perform the resistance test between the network and the antenna. Finally, a third evaluation circuit is used to perform the capacitance test between the network and the antenna. These components enable the determination of the detected resistance value and the detected capacitance value of the complex conductance between the network and the antenna.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF PREFERRED EMBODIMENTS

In the testing method of the present invention is subdivided into a first test routine, in which a first conductor assembly is tested, and subsequent of further test routines for testing additional conductor assemblies based upon the results from the first conductor assembly.

1. First Test Routine

The first test routine comprises a field test for detecting short-circuits between the networks and a resistance test for detecting the existence of any open-circuits.

Figure 1:
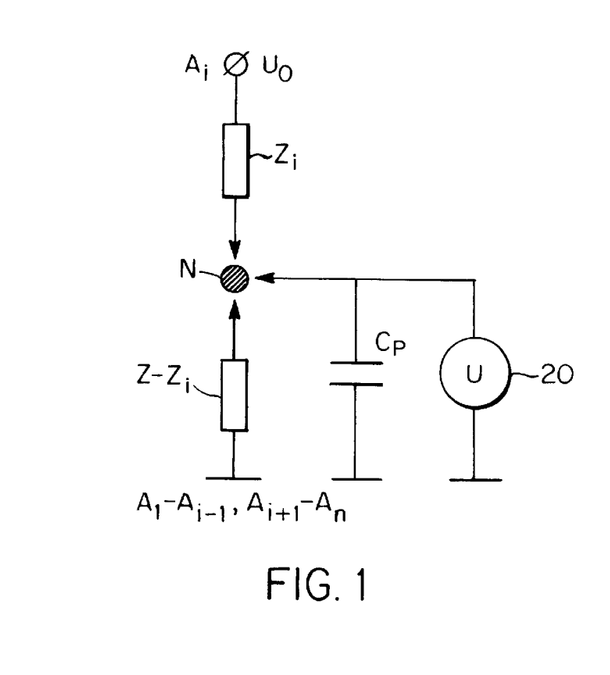
FIG. 1 is a schematic equivalent circuit of a test assembly.

FIG. 1 is a schematic representation of a test assembly for the field test. The test assembly comprises n antennas $A_1$–$A_n$ with which a network N is tested. A complex input voltage $U_0$ is applied to one of the antennas $A_i$ and the remaining antennas $A_i$–$A_{i-1}$ and $A_{i+1}$–$A_n$ are connected to ground (GND). Between the network N and the antenna $A_i$ there is a complex conductance $Y_i = Y_{iR} + iY_{iI} = 1/Z_i$, and between the network N and the remaining antennas there is another complex conductance $Y - Y_i = 1/(Z - Z_i)$, whereby $Y = Y_R + iY_I$ is the total complex conductance between all antennas $A_1$–$A_n$ and the network N. At network N, the complex voltage $U_i = U_{iR} + iU_{iI}$ is sensed by a probe 20 having the capacitance $C_p$.

Figure 2:
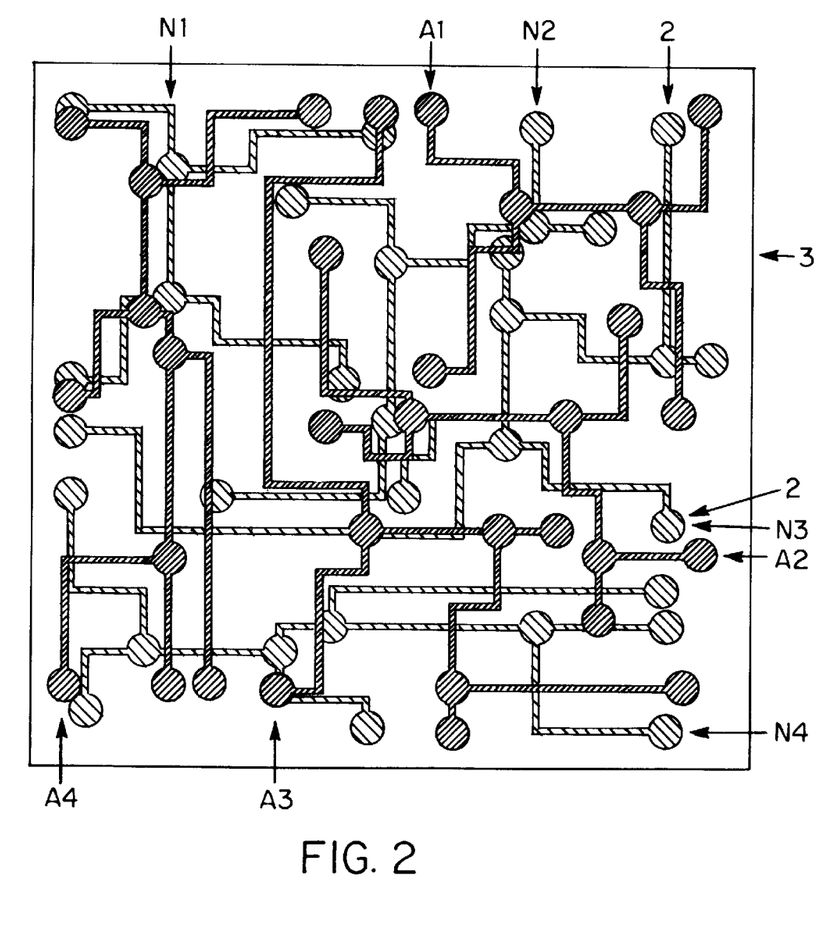
FIG. 2 is a schematic section of a conductor assembly.

FIG. 2 is a schematic representation of a section of an exemplary conductor assembly in which four networks are employed as antennas $A_1$–$A_4$ for testing the further networks $N_1$–$N_4$. Instead of using internal networks of the conductor assembly as antennas (as shown), external antennas may alternatively be used.

Figure 3:
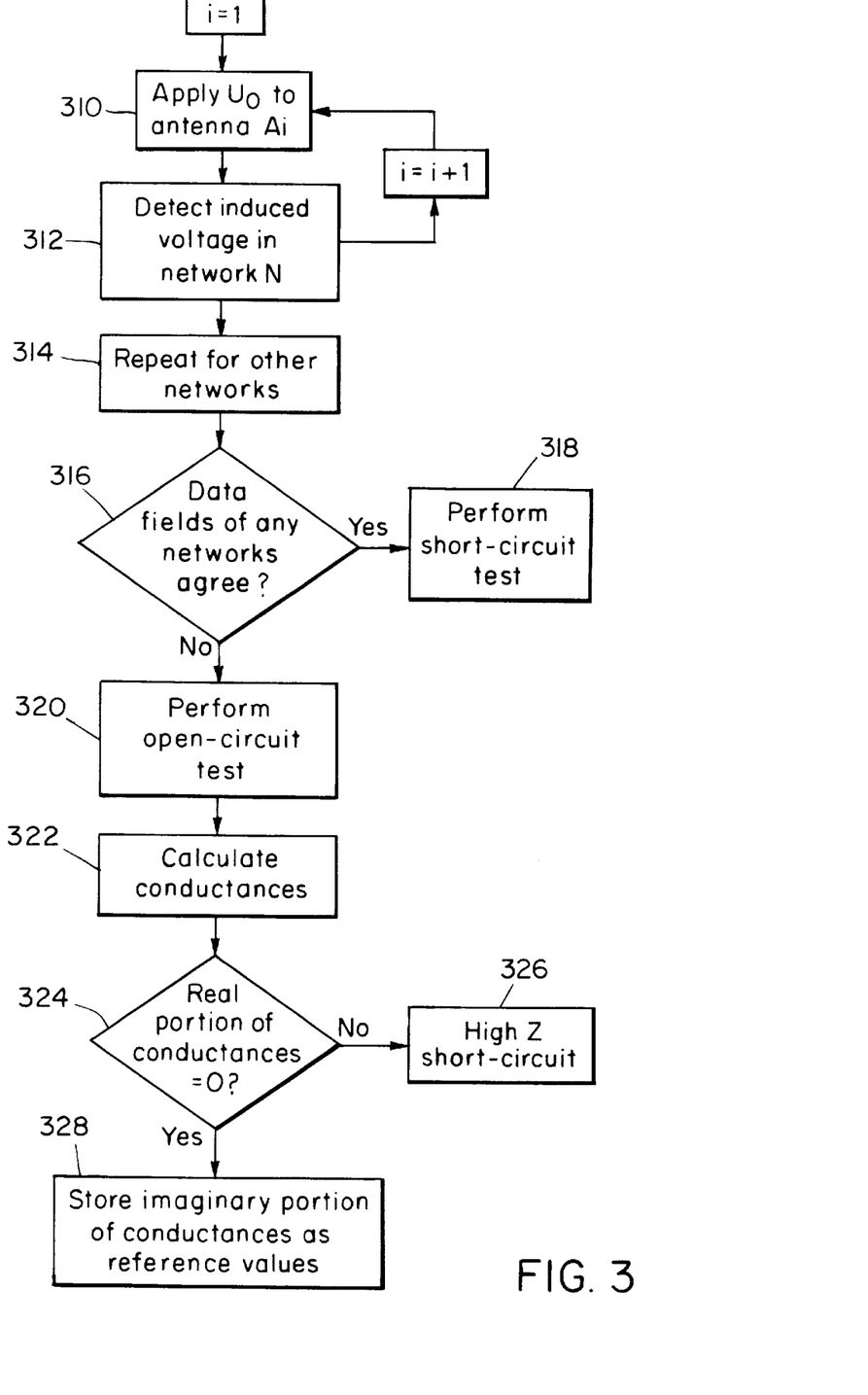
FIG. 3 is a process diagram illustrating the field test according to the invention.

FIG. 3 is a process diagram showing the field test method. The complex input voltage $U_0 = U_{0R} + iU_{0I}$ is preferably a sinewave having a specific frequency (e.g. 2 πω=2 kHz), with the amplitude in the range 4 V to 250 V. This input voltage $U_0$ is applied to each of the antennas $A_i$ in turn in step 310 while the other antennas are connected to the ground. An induced voltage $U_i$ is then sensed each time as the test result at the network N in step 312. This voltage $U_i$ is the potential of the electrical field between the antenna A at which the input voltage $U_0$ is applied and the antennas connected to GND. By means of this voltage test an electrical field is thus detected, this being the reason why this method is termed a field test. The set of test results $U_i$ to $U_n$ forms the data field characteristic of the network N. These data fields are compiled for every network in the assembly in indicated in step 314.

In step 316, the data fields of the individual networks $N_i$–$N_4$ compared for similarities. If the data fields of two networks agree, this is due in most cases to a short-circuit existing between these two networks. This conclusion can be confirmed with a conventional short-circuit test in which the resistance between these two networks is tested (step 318). These short-circuit tests are, however, implemented only on networks having identical data fields or data fields which are similar within certain limits. Thus, the expenditure of testing resources as compared to conventional test methods is very low.

Testing for open-circuits is then implemented by a resistance test in which electrodes at the ends of the network are used to sense the resistance through the network N in step 320.

By combining the test methods involving field and resistance tests in the first test routine is no longer dependent on a golden board or other generated reference data.

From the first test routine a data field having the induced complex voltages $U_1$ to $U_n$ is obtained for each network using the n antennas $A_1$–$A_n$. Furthermore, the complex input voltage $U_0$ and the capacitance $C_p$ of the probe 20 are known.

The invention is based on the knowledge that the complex conductance (=1/impedance) $Y_i = Y_{iR} + iY_{iI} = 1/Z_i$ can be calculated from this data according to the following formulas in step 322:

$$Y_{iI} = \frac{U_{iR} * X_I + U_{iI} * Y_R}{U_0} \quad (1)$$

$$Y_{iR} = \frac{U_{iR} * Y_R - U_{iI} * X_I}{U_0} \quad (2)$$

where $$X_i = Y_i + \omega * C_p \quad (3)$$

The real portion and the imaginary portion of the total conductance Y is obtained from $$Y_I = \frac{\Sigma U_{iR} * (U_0 - \Sigma U_{iR}) - (\Sigma U_{iI})^2}{(U_0 - \Sigma U_{iR})^2 + (\Sigma U_{iI})^2} * \omega * C_p \quad (4)$$

$$Y_R = \frac{-U_0 * \Sigma U_{iI}}{(U_0 - \Sigma U_{iR})^2 + (\Sigma U_{iI})^2} * \omega * C_p \quad (5)$$

where the sum symbol represents in each case a sum of 1 to n of a data field of induced voltages of a given network.

After having computed the complex conductance $Y = Y_R + iY_I$ a test is made to see whether the real portion of the conductance $Y_R$ equals zero in step 324. A non-zero real portion of the conductance ($Y_R \neq 0$) indicates that the tested network N has a high-impedance short-circuit (step 326). If the real portion of the conductance $Y_R$ equals zero, then the imaginary portion of the conductance $Y_i$ is memorized as the reference value in step 328. In this case, the imaginary portion of the conductance represents the capacitance $C_{ia}$ between the antenna $A_i$ and the network N ($Y_i = C_{ia}$).

Experience has shown that the conductances can be established from the data obtained by the field test with an accuracy of better than 1.5% so that this data is suitable as reference values for a test method operating on the basis of a conductance comparison.

This is why in the first test routine the complex conductances $Y_i$ between the networks and the antennas $A_i$ are computed at the same time as testing a conductor assembly. The conductances $Y_i$ and the capacitances $C_{ia}$ respectively are stored as reference values for the subsequent test routines.

It is also possible to compute from the field data, instead of the conductance $Y_i$ or the capacitance $C_{ia}$ between the network $N_k$ and a single antenna $A_i$, the total conductance $Y_{kG}$ and total capacitance $C_{aG}$ existing respectively between the network $N_k$ and several antennas $A_i$ connected to each other electrically. This is expedient when, in the further test routines, an antenna array is employed which has several antennas $A_i$ short-circuited to each other electrically. It is also possible to memorize the data fields of the field test and to compute the corresponding capacitances in each further test routine so that the antenna array can be varied.

2. Further Test Routines

The further test routines are implemented by a conductance test of the conductances $Y_k$ between the networks $N_k$ and each one of the antennas $A_i$. These actual conductances $Y_k$ are compared to the corresponding reference value. Additional tests are performed when deviations exist, which may indicate a short-circuit to another network or an open-circuit in the network.

Detecting a short-circuit may be done similar to the impedance comparison known from prior art (e.g. DE 34 08 704 A1 or EP 0 438 491 B1). In this case the capacitance or the impedance of the network is tested and when there is a departure from the reference value a conventional resistance test is implemented to pin-point the short-circuit.

The drawback in this known method operating on the basis of an impedance comparison is that high-impedance short-circuits cannot be detected by the impedance comparison. These high-impedance short-circuits can thus only be detected in visual inspection of the conductor assembly which is mandatory subsequent to a test method based on an impedance comparison.

This is why, for the following further test routines, the invention preferably provides a modified comparison of the tested conductance $Y_i$ to the reference values for detecting short-circuits. In the further test routines, a simple and speedy test of the conductance $Y_k$ is provided to detect short-circuits in the networks $N_k$ in which the conductance $Y_k$ is the conductance between the network $N_k$ and the antenna $A_i$ in each case. As compared to the field test, the expenditure of the testing resources is diminished significantly, since multiple sensing of a network $N_k$ by several antennas $A_i$ is not necessary. The further test routines for detecting short-circuits between the individual networks $N_k$ is thus based on simply and quickly testing the conductance $Y_k$, whereby high-impedance short-circuits can also be detected. If a short-circuit is detected in a network, then it is pin-pointed by a resistance test in known ways and means.

Figure 4:
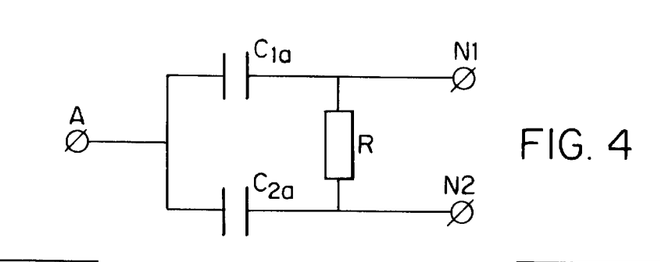
FIG. 4 is a schematic equivalent circuit of a further test assembly.

The test routine according to the invention for establishing whether a short-circuit exists between a network $N_1$ and any other network $N_2$ will now be explained on the basis of the equivalent circuit shown in FIG. 4. In this arrangement the starting point is the conductance $Y_1$ between the antenna A and the network $N_1$, where $C_{1a}$ and $C_{2a}$ represent the capacitances (=reference values) in each case between the antenna A and the networks $N_1$ and $N_2$, and R is the resistance, i.e., the unknown variable, between the two networks $N_1$, $N_2$. The complex conductance is given by:

$$Y_{1R} + iY_{1I} = i\omega * C_{1a} + \frac{i\omega * C_{2a} * \frac{1}{R}}{i\omega * C_{2a} + \frac{1}{R}}. \quad (6)$$

By an expedient transformation, the following results:

$$(Y_{1R})^2 + (Y_{1I} - \omega * C_{1a})^2 = \frac{1}{R^2 + \left(\frac{1}{\omega * C_{2a}}\right)^2}. \quad (7)$$

When taking into account the deviations in the results $\Delta_Y$ for the tested conductance $Y_1$, the maximum deviation $\Delta_c$ between the capacitances of the same networks having differing conductor assemblies and setting the resistance R to be a threshold value $R_{TK}$ and selecting $C_{2a} < C_{1a}$ the above equation can be converted into the following inequality:

$$(abs(Y_{1R}) + \Delta_Y)^2 + (abs(Y_{1I} - \omega * C_{1a}) + \Delta_Y + \Delta_C)^2 \leq \frac{1}{R_{TK}^2 + \left(\frac{1}{\omega * C_{1a}}\right)^2} \quad (8)$$

The values $\Delta_Y$ and $\Delta_c$ are values gained from experience which depend on the test apparatus being used and the nature of the conductor assembly.

The requirement $C_{2a} < C_{1a}$ can be satisfied simply by swapping the corresponding networks N.

If the actual resistance R between the network $N_1$ and all other networks $N_k$ is greater than the threshold value $R_{TK}$ then the above inequality (8) is satisfied and it is established that no short-circuit exists between the network $N_1$ and any other greater network or a network having a greater capacitance.

At the usual frequencies (e.g.: $2\pi\omega = 2$ kHz) the following holds for networks having a small capacitance $C_{1a}$ for threshold values $R_{TK}$ up to 10 MΩ

$$R_{TK}^2 \ll \left(\frac{1}{\omega * C_{1a}}\right)^2, \quad (9)$$

so that the above inequality (8) can be expressed, simplified as follows:

$$(abs(Y_{1R}) + \Delta_Y)^2 + (abs(Y_{1I} - \omega * C_{1a}) + \Delta_Y + \Delta_C)^2 \leq (\omega * C_{1a})^2 \quad (10)$$

This inequality (10) is satisfied for small networks so that the inequality (8) may also be applied in the case of small networks as the criterion for short-circuits. Accordingly, by means of the comparison according to the invention which also involves the real portion of the conductance $Y_R$ it is possible to detect high-impedance short-circuits in networks having a small capacitance.

Open circuits in the networks $N_k$ can be detected in the further test routines either by a resistance test known as such or by a comparing the actual conductance $Y_k$ or the actual capacitance $C_k$ to the memorized reference values.

The networks to be tested often involve L=20,000 or more test points. When all test points are sensed in pairs for a short-circuit test by means of a resistance test, then (L−1) tests are necessary per network. In this arrangement the test points are each sensed in pairs, only certain pairs of test points being sensed to optimize the number of tests, so that test fingers sensing the test points are moved in pairs only by predetermined ways and means. To simplify the test routine it is also known to detect open-circuits by means of a capacitance comparison as disclosed in U.S. Pat. No. 3,975,680, which is incorporated herein in its entirety by this reference. In this arrangement each test point is contacted once by a test finger, the test points being sensed in a predetermined sequence so that the movements of the test fingers are substantially simplified.

In accordance with the invention it is thus proposed to compare the conductance $Y_i$ tested at the test point to the corresponding reference value, this method being implemented only on sufficiently large networks having a sufficiently high capacitance.

The test method according to the invention for detecting open-circuits will be again explained with reference to the equivalent circuit shown in FIG. 3, it being assumed that the network to be tested is divided into two sub-networks $N_1$ and $N_2$ which are separated from each other by the open-circuit to be detected. This open-circuit between $N_1$ and $N_2$ has the resistance R. For the total capacitance memorized as the reference value $C=C_{1a}+C_{2a}$ applies, where $C_{1a}$ and $C_{2a}$ are the capacitances of the sub-networks $N_1$ and $N_2$.

For the conductance $Y_1$ obtained from the sub-network $N_1$ we have:

$$Y_{1R} + iY_{1I} = i\omega C_{1a} + \frac{R + \frac{i}{\omega C_{2a}}}{R^2 + \left(\frac{1}{\omega C_{2a}}\right)^2} \quad (11)$$

so that for the conductance obtained from the sub-network $N_1$ it can be derived from (11):

$$Y_{1I} = \omega C_{2a} \frac{1}{1 + \omega^2 * C_{2a}^2 * R^2} \quad (12)$$

$$Y_{1R} = \frac{1}{R} * \frac{\omega^2 * C_{2a}^2 * R^2}{1 + \omega^2 * C_{2a}^2 * R^2} \quad (13)$$

The difference of the conductance obtained to the reference value is:

$$\omega C - Y_{1I} = \omega C_{2a} \frac{\omega^2 * C_{2a}^2 * R^2}{1 + \omega^2 * C_{2a}^2 * R^2} \quad (14)$$

$$Y_{1R} - 0 = \frac{1}{R} * \frac{\omega^2 * C_{2a}^2 * R^2}{1 + \omega^2 * C_{2a}^2 * R^2} \quad (15)$$

When comparing the values of the imaginary portion and the real portion in $$\frac{\omega * C - Y_{1I}}{Y_{1R}} = \omega * C_{2a} * R, \quad (16)$$

it is then evident that for a given threshold value for open-circuits $R_{TU}$ and for small values of $C_{2a}$ a change in the real portion of the conductance $Y_1R$ results in a greater departure than a change in the imaginary portion. The real portion of the conductance is thus more sensitive than the imaginary portion. To ascertain which networks can be tested for open-circuits by means of a conductance comparison, the accuracy of the conductance test $\delta=\Delta_Y/Y$ is introduced as a scalar variable $\alpha=\omega C_{2a}R \leq 1$. For the sub-network to be tested $C_{1a} \leq C_{2a}$, $C_{1a} \leq C/2$ and $C_{2a} \geq C/2$ furthermore applies.

The real portion can be realized when in accordance with (15)

$$Y_{1R} = \frac{\omega * C_{2a}}{\alpha} * \frac{\alpha^2}{1 + \alpha^2} \geq \frac{\omega * C_{2a} * \alpha}{2} \geq \frac{R_{TU} * \omega^2 * C^2}{8}$$

is greater than $$\frac{\delta * \omega * C}{2} > \delta * \omega * C_{1a} = \Delta_Z$$

For the criterion as to whether a network can be tested for open-circuits by a conductance comparison we thus have:

$$C > \frac{4 * \delta}{\omega * R_{TU}} \quad (17)$$

For typical values of $R_{TU}$=1 kΩ, $\delta$=0.3% and $\omega=2\pi*2.000$ 1/s a minimum capacitance of approximately 1 nF materializes. Such capacitances are generally achieved by largish conductor assemblies involving a few hundred or more test points.

In establishing the test criteria it is assumed that a<1 and thus $\omega C - Y_{1I} \leq (\omega C_{2a})/2 < (\omega C)/4$ applies. When furthermore taking into account the testing accuracy $\Delta_Y$ and the maximum deviation of the capacitance $\Delta_C$ between identical networks of differing conductor assemblies then the criterion as to whether an open-circuit exists is $$\omega * C - Y_{1I} + \Delta_Y + \Delta_C < \frac{\omega * C}{4} \quad (18)$$

and $$Y_{1R} + \Delta_Y < \frac{R_{TU} * \omega^2 * C^2}{8} \quad (19)$$

If the two inequalities (18) and (19) are satisfied, then no open-circuit exists. However, if it does exist, the open-circuit can be pin-pointed by means of a resistance test known as such.

Figure 5A:
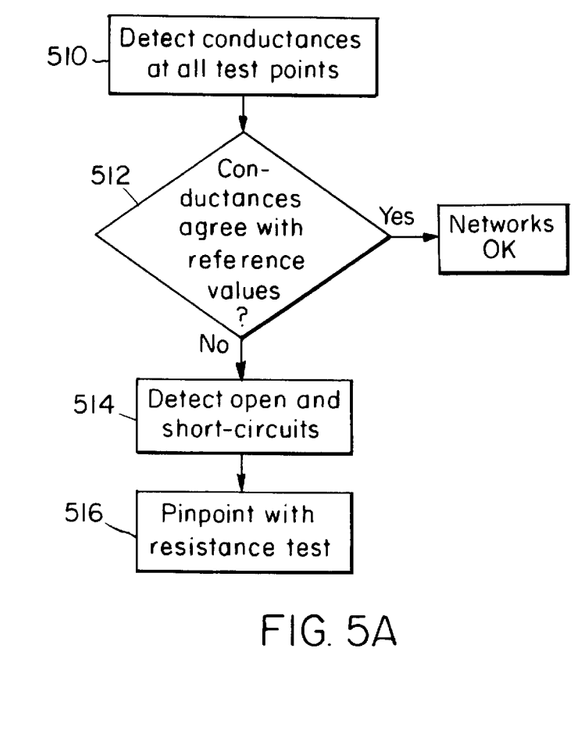
FIGS. 5A and 5B are process diagrams illustrating the further test routine for larger and smaller networks, respectively.

As shown in FIG. 5A, the test method for the further test points can thus be summarized as follows for sufficiently large networks satisfying the inequality (17):

Firstly) At all test points the conductance $Y_k$ is sensed (step 510).

Secondly) If all conductances are identical and agree with the reference value, then the network has neither a short-circuit nor an open-circuit (step 512).

Thirdly) If a conductance deviates from the reference value, it is applied to the test criteria in accordance with the inequality (18) to detect short-circuits or in accordance with inequalities (18) and (19) to detect open-circuits, so that the nature of the defect is determined (step 514).

Fourthly) Any short-circuit or open-circuit detected can then be pin-pointed by a resistance test by ways and means known as such (step 516).

Figure 5B:
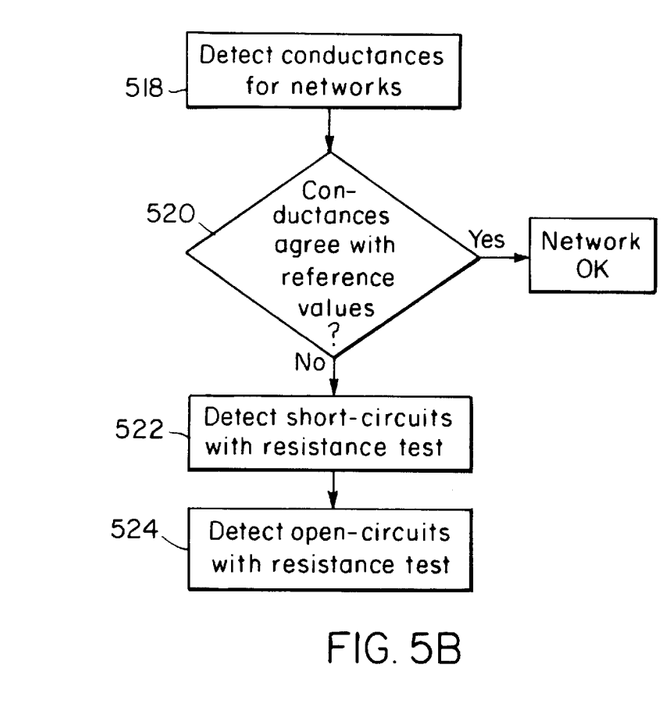

As shown in FIG. 5B, in the case of smallish networks which do not satisfy the inequality (17) the following test method is preferably implemented:

Firstly) In the network $N_k$ being tested a conductance $Y_k$ is detected (step 518).

Secondly) If the conductance deviates from the reference value (step 520), it is applied to the test criterion in accordance with inequality (8) and if a short-circuit is detected the short-circuit is pin-pointed by a resistance test (step 522).

Thirdly) Open circuits are detected by resistance tests by ways and means known as such, whereby all test points are sensed pairwise (step 524).

For detecting short-circuits and open-circuits in this way it is necessary that reference capacitances exist. These do not need to be determined by a field test, of course. Instead, they can be determined also by the methods known for determining reference impedances.

Should in a first test routine one or more networks prove be defective, then a distinction is made as to whether more or less than a predetermined number of networks g are defective. If more than the predetermined number of networks g are defective, then the field test is repeated with a new conductor assembly, the missing reference values being supplemented by the new test results from non-defective networks. If less than the predetermined number of networks g are defective, then a further test routine is implemented in which the complex conductance $Y_k$ is obtained, it being established by resistance tests on the network or between the networks or by comparing the imaginary portion $Y_{kI}$ or the capacitance $C_{ka}$ of the network found to be defective in the first test routine to the capacitances of the remaining networks and a resistance test to be implemented if necessary between networks having the same capacitance whether a defect in turn exists in the same network. If the network is not defective, the sensed conductance $Y_k$ or the sensed capacitance $C_{ka}$ is stored as the reference value.

3. Testing Apparatus

Figure 6:
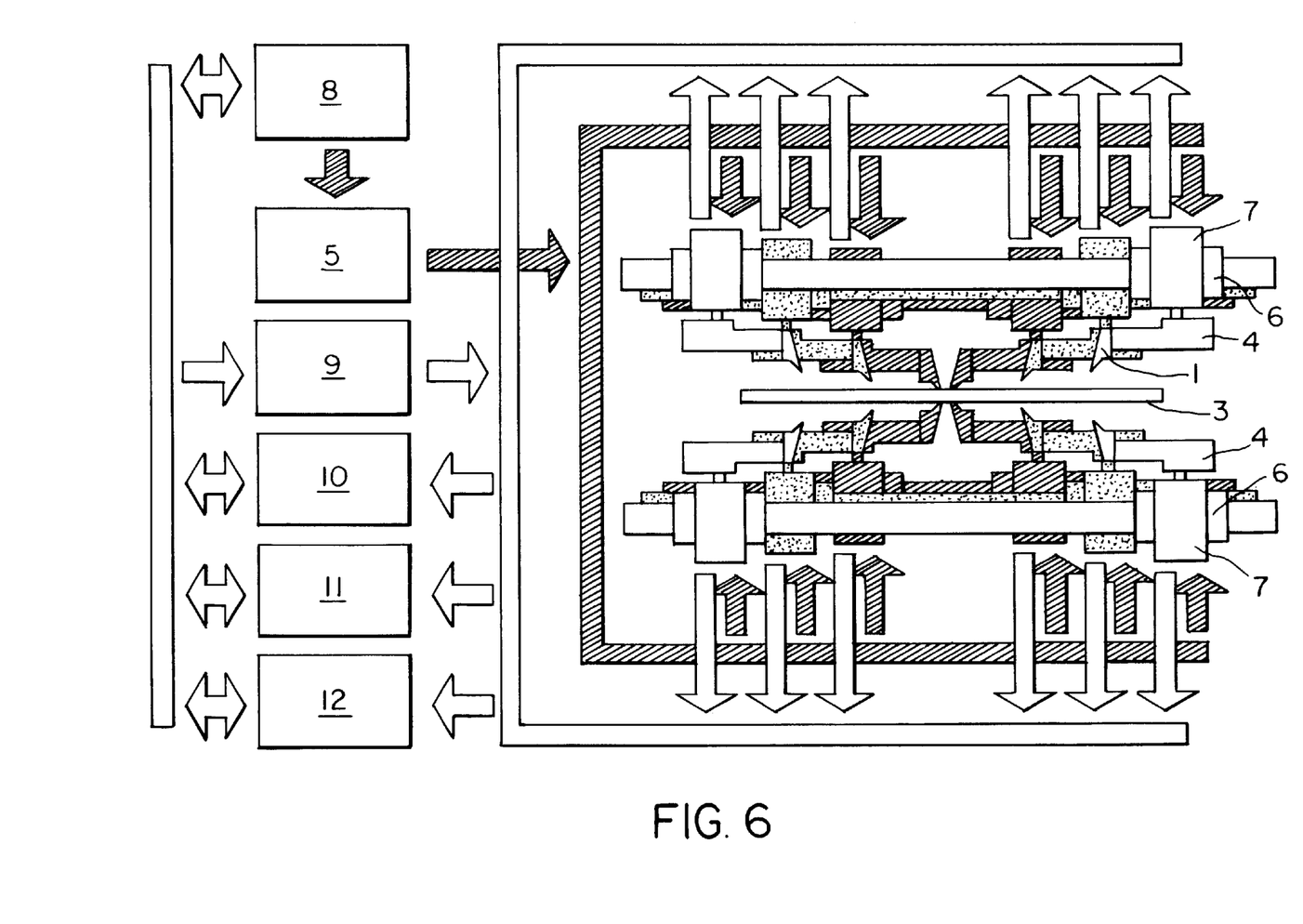
FIG. 6 is a schematic of a multi-finger system for sensing a conductor assembly.

An apparatus for implementing the method comprises several electrodes 1 which can be brought into contact with the test points 2 of the networks $N_k$ on a conductor assembly 3 (FIGS. 2, 6). The electrodes 1 are preferably usable as antenna probes and test probes. As antenna probes they apply either the input voltage $U_0$ or GND to the networks connecting them, so that the networks connected to them act as antennas. The test probe senses the voltage $U_i$ induced in the network.

One preferred embodiment of the test apparatus is a so-called multi-finger system shown in FIG. 6 in which an electrode 1 is integrated in each test finger 4. A multi-finger system in which each test finger can be moved independently of the other is described in EP 0 468 153 A1, which is incorporated herein in its entirety by this reference. The test fingers 4 can be shifted parallel to the surface of the conductor assembly 3 so that the electrodes can be brought into contact with specific test points 2 of the networks $N_k$. One such multi-finger system comprises sixteen test fingers 4, eight of which are arranged above the conductor assembly 3 and eight below so that the conductor assembly 3 may be contacted on both sides. Each of the test fingers 4 is secured to a slider 6 controlled by a positional controller 5 capable of moving the slider in a plane parallel to the conductor assembly 3. Each of the sliders 6 is provided with a vertically oriented actuating cylinder 7 with which the test fingers 4 can be rotated about the vertical axis. In addition, a tilt mechanism is integrated in the test fingers 4 so that each finger can be lowered together with the probe 1 to the conductor assembly 3.

In the first test routine a field test and a resistance test are implemented. For the field test the conductor assembly 3 is divided into certain segments, specific networks of each segment being selected as antennas for that segment. Each of the networks selected as antennas is in contact with one of the electrodes 1 during testing of this segment, each of the other electrodes 1 being alternately brought into contact with one network of the segment to detect the induced voltage $U_i$. The network to be tested is simultaneously brought into contact with a further electrode 1 at least at one further test point 2 so that the resistance value of the network can be sensed between the two electrodes 1. In the resistance test the networks are tested for open-circuits, all test points being sensed thereby in pairs in a network.

For controlling the movements of the test fingers 4 the positional controller 5 receives its signals from a central control unit 8. In the field test the central control unit 8 connects one antenna of the segment to a function generator 9 which outputs the test voltage $U_0$ and connects the other antennas to GND. In addition, the central control unit provides a connection of the network $N_k$ to be tested via a sole electrode 1 to a first evaluation circuit 10 for the field test. The voltage $U_i$ in the network N is then sensed. Further networks $N_k$ can be sensed in the region of a segment without the electrodes 1 in contact with the antennas being moved, i.e. only the electrodes 1 for contacting the tested networks is moved.

For the resistance test each of the test points 2 of the network $N_k$ is brought into contact with an electrode 1 in pairs. The resistance value of this network is received by a second evaluation circuit 11 and passed on to the central control unit.

In the first test routine the electrodes 1 in contact with the antennas are not moved, and the other electrodes 1 are brought into contact with the networks to be tested.

The first evaluation circuit 10 receives the sensed voltages $U_i$ (field test) and passes them on to the central control unit which establishes and stores the reference conductances.

In the further test routines in the case of sufficiently large networks which satisfy the inequality (17) only a single resistance value and a capacitance value is tested between the network and the antenna at each test point 2 as the conductance $Y_k$. The inductance of the networks is so low that it can be ignored.

The test fingers 4 are signaled such that in any one segment one single electrode 1 is in contact with an antenna or an antenna array and the other test fingers 4 sense the test points 2 to be tested by their electrodes 1 so that the capacitances $C_k$ or the imaginary portion of the conductance $Y_{kI}$ between the antenna A and the network $N_k$ to be tested are received by a third evaluation circuit 12 at the corresponding test point 2. The resistance or the real portion $Y_{kR}$ between the antenna A and the network $N_k$ to be tested is sensed by the second evaluation circuit 11.

In the case of large networks, one probe 1 is permanently in contact with an antenna in a further test routine, and each test point 2 is brought into contact once with a probe 1 to receive the conductance.

In the case of small networks, which do not satisfy the inequality (17) first a conductance test is implemented between the antenna A and the network $N_k$, for the purpose of which one probe 1 is brought into contact with an antenna and a further probe 1 is brought into contact with a test point 2 of the network. To test for open-circuits all test points are contacted in pairs by two probes 1.

The second and third evaluation circuits 11, 12 for detecting a resistance or a capacitance are based on a current test, unlike the first evaluation circuit 10 which receives the field values by a voltage test. By providing three evaluation circuits 10, 11, 12 in a single test apparatus it is possible to implement the method according to the invention based on both a field test and on a conductance test.

A multi-finger system, the central control unit 8 of which is configured to implement the methods according to the invention needs to implement a much smaller number of movements of the test fingers 4 in testing the same conductor assemblies as compared to known multi-finger systems, since short-circuits can be detected by a single conductance test per network, and open-circuits by a single conductance test per test point in the case of large networks. The improvements achieved by the invention are based, among other things, on the fact that the conductances and not, as in prior art, their inverse values, the impedances are tested, as a result of which the data contained therein can be evaluated more effectively.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A method of testing electrical conductor assemblies having a plurality of networks which is divided into a first test routine and further test routines, and in which conductor assemblies are tested in each test routine, wherein the first test routine comprises:

a field test for detecting short-circuits between the networks;

a resistance test for detecting open circuits in said networks; and from data sets generated based on said field test, complex conductances are determined between at least one antenna employed in said field test and the networks being tested which are used as reference conductances for the further test routines;

wherein the further test routines comprise:

detecting short-circuits between said networks and/or open-circuits in said networks by sensing a complex actual conductance between individual ones of the networks and at least one antenna; and comparing said actual conductance to said reference conductances.

2. The method as set forth in claim 1, wherein during said first test routine the complex conductances are established from said data sets resulting from said field test and stored as reference values.

3. The method as set forth in claim 2, wherein said complex conductances comprising a real portion and an imaginary portion are only employed as reference values when said real portion equals zero, the imaginary portion of said conductance then being stored as the reference value, corresponding to the capacitance between said antenna and said network.

4. The method as set forth in claim 3, wherein in the field test, several antennas $A_1$ to $A_n$ are employed, an input voltage $U_o$ being applied to one each of the antennas $A_i$ of the antennas $A_1$ to $A_n$ in sequence during testing of a network N, whilst the remaining antennas are connected to GND and one voltage $U_i$ each is sensed at said network N.

5. The method as set forth in claim 4, wherein said input voltage $U_0$ is preferably a sinewave having a specific frequency, the amplitude being in the range 4 V to 250 V.

6. The method as set forth in claim 4, wherein said reference conductance $Y_i = Y_{iR} + iY_{iI}$ is computed from said input voltage $U_0$ applied to said antenna $A_i$ in the field test, the angular frequency $\omega$, the voltage values $U_i = U_{iR} + U_{iI}$ and a probe capacitance $C_p$ of which are computed by the following equations:

$$Y_{iI} = \frac{U_{iR} * X_I + U_{iI} * Y_R}{U_0}$$

$$Y_{iR} = \frac{U_{iR} * Y_R - U_{iI} * X_I}{U_0}$$

where $$X_i = Y_i + \omega * C_p$$

$$Y_I = \frac{\Sigma U_{iR} * (U_0 - \Sigma U_{iR}) - (\Sigma U_{iI})^2}{(U_0 - \Sigma U_{iR})^2 + (\Sigma U_{iI})^2} * \omega * C_p$$

$$Y_R = \frac{-U_0 * \Sigma U_{iI}}{(U_0 - \Sigma U_{iR})^2 + (\Sigma U_{iI})^2} * \omega * C_p$$

and said real portion and said imaginary portion of said total conductance $Y = Y_R + iY_I$ are determined as follows where the sum symbols each represent a sum of 1 to n over the number n of antennas employed.

7. The method as set forth in claim 6, wherein networks of the conductor assembly are employed as said antennas $A_1$ to $A_n$.

8. The method as set forth in the claim 6, wherein conductance paths configured separately from said conductor assembly are employed as said antennas $A_1$ to $A_n$ which may be preferably placed directly on said conductor assembly.

9. The method as set forth in claim 6, wherein said networks N of said conductor assembly to be tested are employed as antennas and voltages $U_i$ are sensed at conductance paths configured separately relative to said conductor assembly.

10. The method as set forth in claims 1, wherein if more than the predetermined number of networks g are defective, then the field test is repeated with a further conductor assembly, the missing reference values being supplemented by the new test results on non-defective networks; and if less than the predetermined number of networks g are defective, then a further test routine is implemented in which the complex conductance ($Y_k$) is obtained, it being established by resistance tests on the network or between the networks or by comparing the conductance of said network found to be defective in said first test routine to the conductances of the remaining networks and a resistance test to be implemented if necessary between networks having the same capacitance to determine whether a defect in turn exists in the same network, and should this not be the case, then said sensed conductance ($Y_k$) is memorized as the reference value.

11. The method as set forth in claim 1, wherein a complex total conductance between several antennas employed in said field test and one of said networks tested is established from the data sets resulting from said field test, and said antennas forming the basis of said total conductance are electrically connected to a single antenna in the further test routines.

12. The method as set forth in claim 1, wherein in comparing said actual conductance and said reference conductance only the capacitances contained in said conductances are compared to each other by ways and means known as such.

13. A method of testing electrical conductor assemblies having a plurality of networks, whereby data sets of complex conductances between at least one antenna ($A_i$) and said networks ($N_k$) to be tested are memorized as reference conductances ($C_{ka}$), in which detection of short-circuits between said networks is implemented by sensing actual conductance ($Y_k = Y_{kR} + iY_{kI}$) between said antenna ($A_i$) and at least one of said networks ($N_k$) to be tested and sensing of short-circuits results from a comparison in which real portion ($Y_{kR}$) of said actual conductance is involved.

14. The method as set forth in claim 13 wherein, said comparison is based on the following inequality $$(\text{abs}(Y_{kR}) + \Delta_Y)^2 + (\text{abs}(Y_{kI} - \omega * C_{ka}) + \Delta_Y + \Delta_C)^2 \leq \frac{1}{R_{TK}^2 + \left(\frac{1}{\omega * C_{ka}}\right)^2}$$

and a short-circuit exists when said inequality is not satisfied, where $\Delta_Y$ is the deviation in the result for the sensed conductance $Y_k$ and $\Delta_C$ is the maximum deviation between said capacitances of the same networks of differing conductor assemblies and $R_{TK}$ is a threshold value.

15. The method as set forth in claim 14 wherein when a short-circuit is sensed a resistance test is implemented to pin-point said short-circuit.

16. A method of testing an electrical conductor assembly having a plurality of networks, comprising:
generating and storing data sets of complex conductances between at least one antenna ($A_i$) and said networks ($N_k$) to be tested as reference conductances ($C_{ka}$);
detecting open-circuits between said networks by sensing an actual conductance ($Y_k = Y_{kR} + iY_{kI}$) between said antenna ($A_i$) and at least one of said networks ($N_k$) to be tested; and
sensing short-circuits by comparing a real portion ($Y_{kR}$) of said actual conductance.

17. The method as set forth in claim 16 wherein said comparison is based on the following inequalities $$\omega * C - Y_{kI} + \Delta_Y + \Delta_C < \frac{\omega * C}{4}$$

$$Y_{kR} + \Delta_Y < \frac{R_{TU} * \omega^2 * C^2}{8}$$

and no open-circuit exists when both inequalities are satisfied, where $\Delta_Y$ is the deviation in the result for the sensed conductance $Y_k$ and $\Delta_C$ is the maximum deviation between said capacitances of the same networks of differing conductor assemblies and $R_{TU}$ is a threshold value.

18. The method as set forth in claim 17 wherein said comparison of said conductances for detecting open-circuits is implemented only on networks satisfying the following inequality $$C_k > \frac{4 * \delta}{\omega * R_{TU}},$$

where $\delta = \Delta Y / Y$ is the accuracy of the conductance test and $C_k$ is the capacitance of said network $N_k$ memorized particularly as said reference value.

19. The method as set forth in claim 18 wherein in networks in which open-circuits are not detected by a conductance comparison, said open-circuits are detected by a resistance test.

20. The method as set forth in claim 16 wherein an apparatus for testing the electrical conductor assembly comprises:
electrodes which can be brought into contact with predetermined test points on said networks of said conductor assembly;
a function generator for outputting an input voltage to an antenna;
a first evaluation circuit for implementing a field test, a voltage being sensed at said network to be tested;
a second evaluation circuit for implementing a resistance test between said network and said antenna; and
a third evaluation circuit for implementing a capacitance test between said network and said antenna, so that from the detected resistance value and the detected capacitance value the complex conductance between said network and said antenna can be formed.

21. The method as set forth in claim 20 wherein several test fingers in each of which an electrode is integrated and which can be moved by a positioning device along a conductor assembly and a central control unit which controls said positioning device, said function generator and said three evaluations circuits such that in a first test routine a field test is implemented, to detect short-circuits between said networks to be tested in said conductor assembly and said first evaluation circuit as a result of said data sets established when said field test detects said complex conductances between said tested networks and each of said antennas, which are stored as reference conductances, so that the further test routines for detecting short-circuits and/or open-circuits can be implemented by comparing a detected complex actual conductance to a complex reference conductance.

22. The method as set forth in claim 21 wherein said apparatus comprises several test fingers preferably eight or more test fingers.

23. The method as set forth in claim 22 wherein said test fingers are arranged on both sides of said conductor assembly.

24. The method as set forth in claim 20 wherein said central control unit is configured such that in the comparison between said complex actual conductance and said complex reference conductance implemented in said further test routines the real portion of said actual conductance is taken into account.

25. A method of testing electrical conductor assemblies, comprising:
generating data sets by detecting electrical coupling between individual networks of the electrical conductor assemblies and at least one antenna;
detecting open circuits in said networks;
from the data sets, determining complex reference conductances between the at least one antenna and the networks;
detecting short-circuits between said networks and/or open-circuits in said networks in further conductor assemblies by sensing complex actual conductances between each network and at least one antenna; and
comparing said actual conductances to said reference conductances.

26. The method as set forth in claim 25, wherein the complex reference conductances are established from said data sets and stored as reference values.

27. The method as set forth in claim 26, wherein said complex reference conductances comprise a real portion and an imaginary portion and are only employed as reference values when said real portion equals zero, the imaginary portion of said conductance then being stored as the reference value, corresponding to the capacitance between said antenna and said network.

28. The method as set forth in claim 25, wherein several antennas are employed, with an input voltage being applied to each one of the antennas in sequence during testing of a network, while the remaining antennas are connected to ground and voltage is sensed at the network.

29. The method as set forth in claim 28, wherein said input voltage is a sinewave having a predetermined frequency and an amplitude in the range 4 V to 250 V.

30. The method as set forth in claim 28, wherein networks of the conductor assembly are employed as said antennas.

31. The method as set forth in claim 28, wherein conductance paths configured separately from said conductor assembly are employed as said antennas.

32. The method as set forth in claim 28, wherein said networks of said conductor assemblies to be tested are employed as antennas and voltages are sensed at conductance paths configured separately relative to said conductor assembly.

33. The method as set forth in claim 25, wherein if more than the predetermined number of networks are defective, then the missing reference values are supplemented by the new test results on non-defective networks; and if less than the predetermined number of networks are defective, then the complex conductances are obtained and stored as the reference values.

34. The method as set forth in claim 25, wherein a complex total conductance between several antennas and one of said networks tested is established from the data sets; and said antennas forming the basis of said total conductance are then electrically connected to a single antenna for subsequent steps.

35. A method of testing electrical conductor assemblies having a plurality of networks, comprising:

storing data sets of complex reference conductances between at least one antenna and said networks;

detecting open-circuits between said networks by sensing actual conductances between said antenna and said networks; and sensing short-circuits by comparing real portions of said actual conductances and the stored data sets.

36. The method as set forth in claim 35, wherein in networks in which open-circuits are not detected by a conductance comparison, said open-circuits are detected by a resistance test.

37. An apparatus for testing an electrical conductor assembly having a plurality of networks, comprising:

electrodes which can be brought into contact with predetermined test points on said networks of said conductor assembly;

a function generator for outputting an input voltage to an antenna;

evaluation circuits detecting voltages between networks and antennas; and a control unit for storing data sets of complex reference conductances between at least one antenna and said networks, detecting open-circuits between said networks in response to conductances between said antenna and said networks, and detecting short-circuits by comparing real portions of actual conductances and stored data sets.

* * * * *

UNITED STATES PATENT AND TRADEMARK OFFICE
CERTIFICATE OF CORRECTION

PATENT NO. : 5,903,160
DATED : May 11, 1999
INVENTOR(S) : Evgueni Ianenko, Peter Bieber, and Uwe Rothaug It is certified that error appears in the above-identified patent and that said Letters Patent is hereby corrected as shown below:

On the title page, item [54] and Column 1;

The title "Method and Apparatus for Testing an Electrical Conductor Assembly" should be changed to --Method and Apparatus for Testing an Electrical Conductor Assembly by Comparing Detected Conductances to Reference Conductances Established During Field and Resistance Tests--;

Signed and Sealed this

Sixteenth Day of November, 1999

Attest:

Q. TODD DICKINSON

*Attesting Officer*  *Acting Commissioner of Patents and Trademarks*

UNITED STATES PATENT AND TRADEMARK OFFICE
CERTIFICATE OF CORRECTION

PATENT : 5,903,160
DATED : May 11, 1999
INVENTOR(S) : Evgueni Ianenko, Peter Bieber, and Uwe Rothaug It is certified that error appears in the above-identified patent and that said Letters Patent is hereby corrected as shown below:

On the title page, item [54] and Column 1;

The title "Method and Apparatus for Testing an Electrical Conductor Assembly" should be changed to --Method and Apparatus for Testing Electrical Conductor Assembly by Comparing Detected Conductances to Reference Conductances Established During Field and Resistance Tests--;

This certificate supersedes Certificate of Correction issued November 16, 1999.

Signed and Sealed this

Ninth Day of May, 2000

*Attest:*

Q. TODD DICKINSON

*Attesting Officer*  *Director of Patents and Trademarks*